(12) United States Patent
Davidson et al.

(10) Patent No.: US 11,523,531 B2
(45) Date of Patent: Dec. 6, 2022

(54) SPRING LOCK

(71) Applicant: Utah State University Research Foundation, North Logan, UT (US)

(72) Inventors: Morgan E. Davidson, River Heights, UT (US); Mike S. Watson, North Logan, UT (US)

( * ) Notice: Subject to any disclaimer, the term of this patent is extended or adjusted under 35 U.S.C. 154(b) by 1485 days.

(21) Appl. No.: 15/703,296

(22) Filed: Sep. 13, 2017

(65) Prior Publication Data

US 2018/0014421 A1 Jan. 11, 2018

Related U.S. Application Data

(63) Continuation of application No. 13/887,128, filed on May 3, 2013, now abandoned.

(51) Int. Cl.
*H05K 7/14* (2006.01)

(52) U.S. Cl.
CPC ...... *H05K 7/1404* (2013.01); *Y10T 29/49826* (2015.01); *Y10T 403/602* (2015.01)

(58) Field of Classification Search
None
See application file for complete search history.

(56) References Cited

U.S. PATENT DOCUMENTS

| | | | |
|---|---|---|---|
| 4,550,836 A | 11/1985 | Ellis | |
| 4,603,928 A | 8/1986 | Evans | |
| 4,785,379 A * | 11/1988 | Goodrich | H05K 7/1404 165/185 |
| 4,829,402 A * | 5/1989 | Gewebler | H05K 7/1404 361/802 |
| 5,259,516 A * | 11/1993 | Ellis | H05K 7/1404 211/41.17 |
| 5,883,784 A * | 3/1999 | Hughes | H05K 7/1404 174/16.3 |
| 7,477,524 B2 | 1/2009 | Way | |
| 2006/0198111 A1 | 9/2006 | Way | |

(Continued)

FOREIGN PATENT DOCUMENTS

| | | |
|---|---|---|
| EP | 0071398 A1 | 2/1983 |
| FR | 1594979 | 6/1970 |

(Continued)

OTHER PUBLICATIONS

The International Search Report and The Written Opinion of the International Searching Authority, or the Declaration, dated Feb. 10, 2014 for PCT/US2013/039551, filed May 3, 2013.

*Primary Examiner* — Courtney L Smith

(57) ABSTRACT

A spring lock includes a sinusoidal spring that has one or more crests and troughs formed along a length of the sinusoidal spring, the length extending along a sliding axis, the one or more crests and troughs forming a sinusoidal spring profile. The spring lock further includes a lock bar that has a track extending along the sliding axis, the track being configured to hold the sinusoidal spring and allow the sinusoidal spring to move along the sliding axis, the track further including one or more depressions and plateaus with the depressions and plateaus forming a lock bar profile, wherein the spring lock is locked when the sinusoidal spring profile and the lock bar profile are out-of-phase and the spring lock is unlocked when the sinusoidal spring profile and the lock bar profile are in-phase.

12 Claims, 10 Drawing Sheets

(56) References Cited

U.S. PATENT DOCUMENTS

| | | | |
|---|---|---|---|
| 2008/0060789 A1* | 3/2008 | Lee | H05K 7/20545 165/80.2 |
| 2014/0328616 A1 | 11/2014 | Davidson et al. | |
| 2015/0035212 A1 | 1/2015 | Peeters et al. | |

FOREIGN PATENT DOCUMENTS

| | | | |
|---|---|---|---|
| GB | 2076228 | A | 11/1981 |
| JP | 2001187539 | A | 7/2001 |
| JP | 2010089570 | A | 4/2010 |
| JP | 2010095171 | A | 4/2010 |
| KR | 1020010055949 | A | 7/2001 |
| KR | 1020130029449 | A | 3/2013 |
| WO | 2009000003 | | 12/2008 |

* cited by examiner

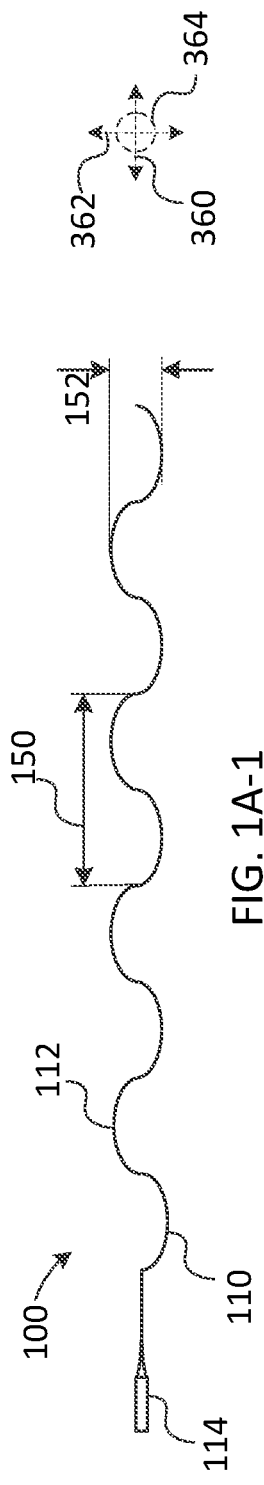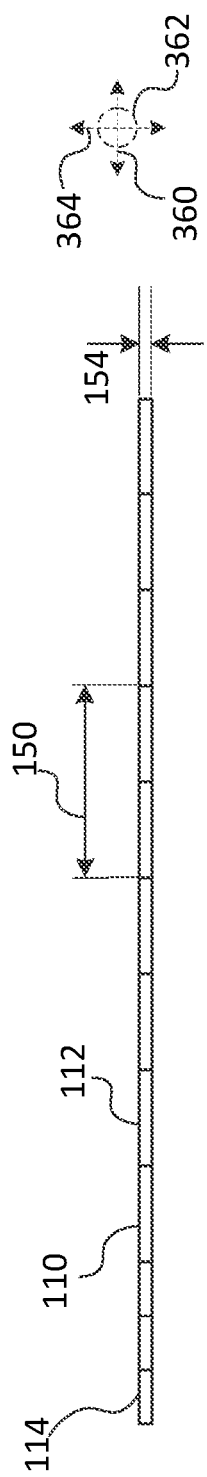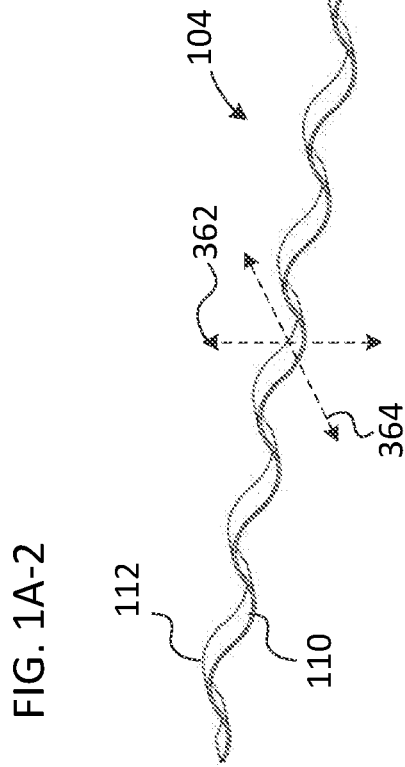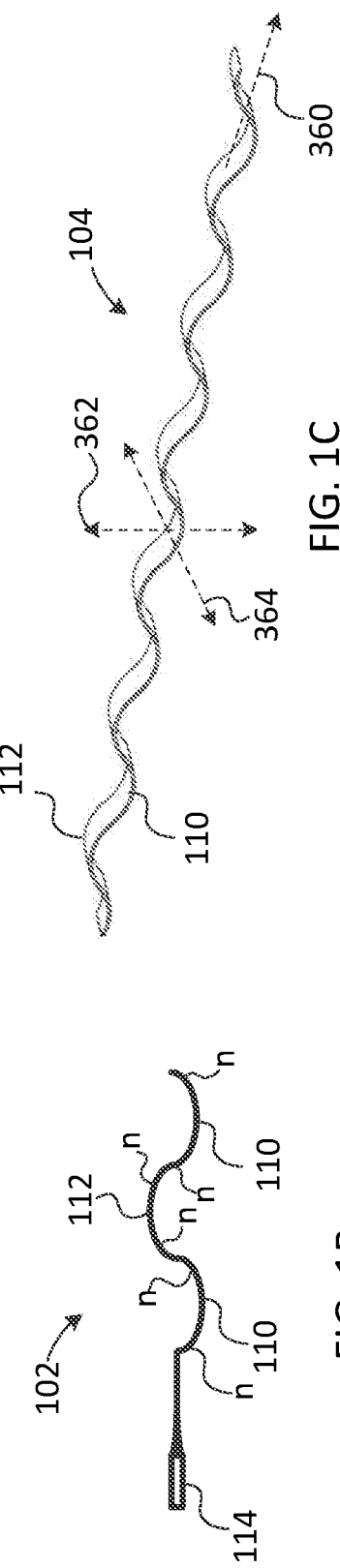

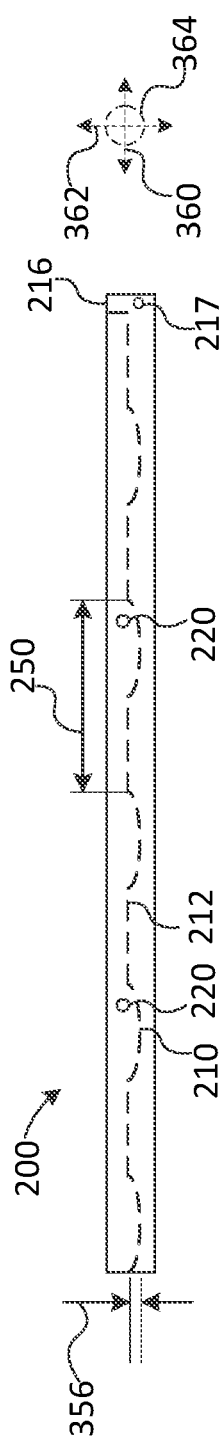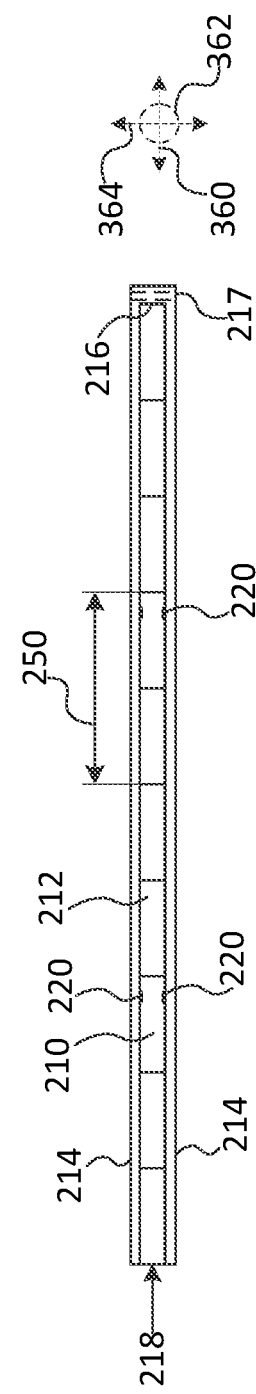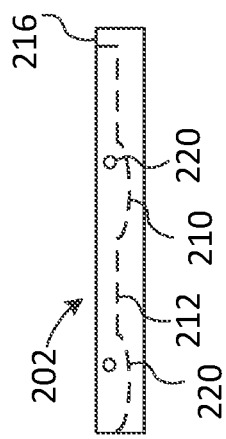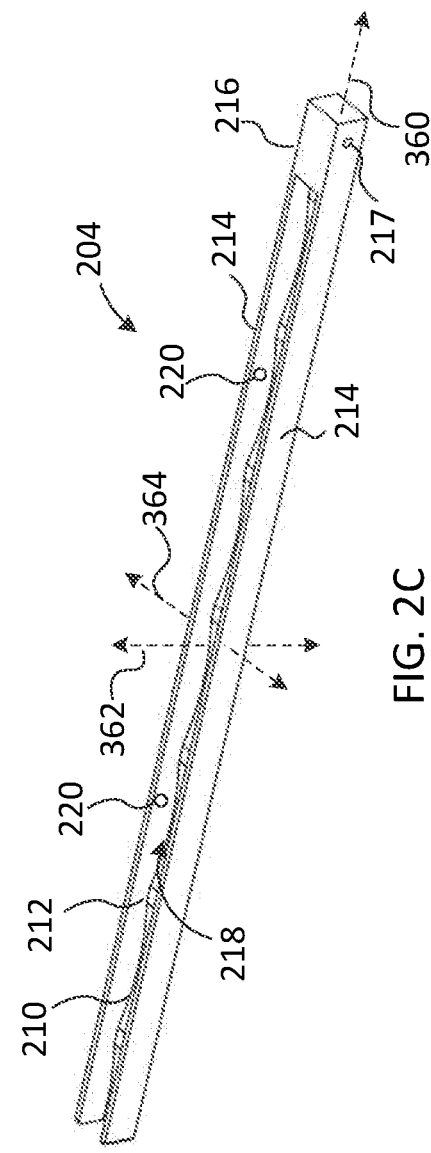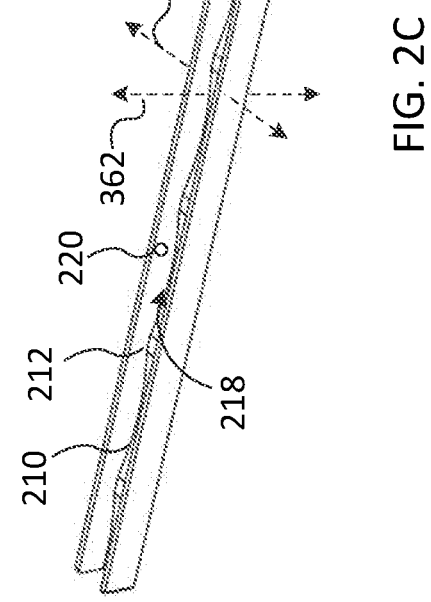

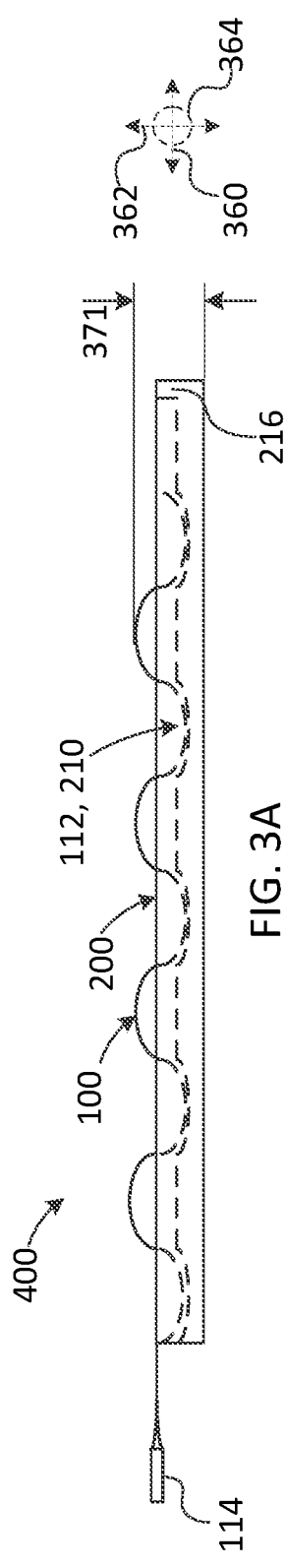
FIG. 3A
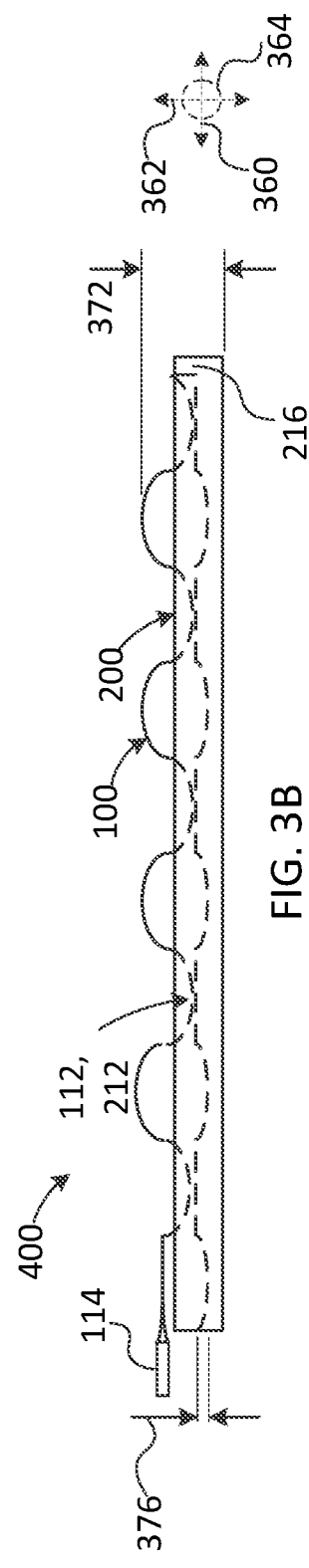
FIG. 3B
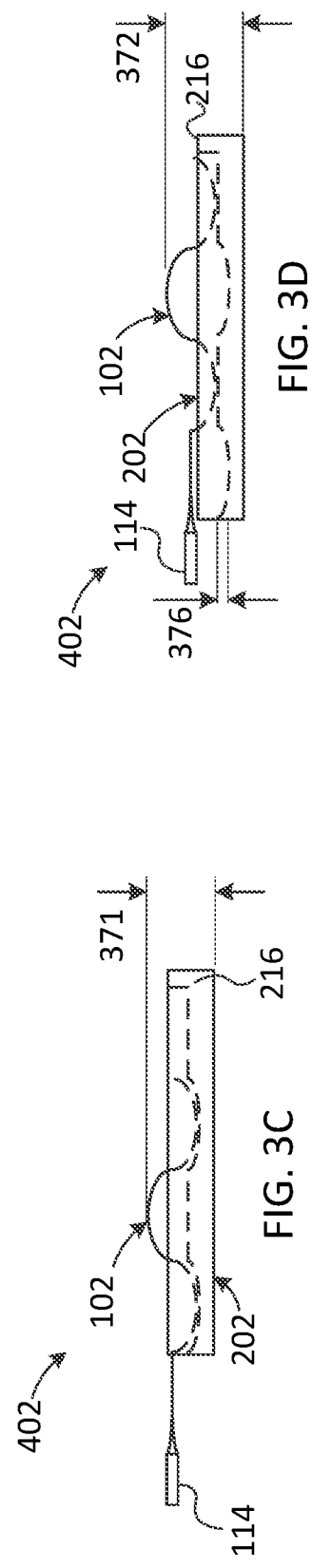
FIG. 3D
FIG. 3C

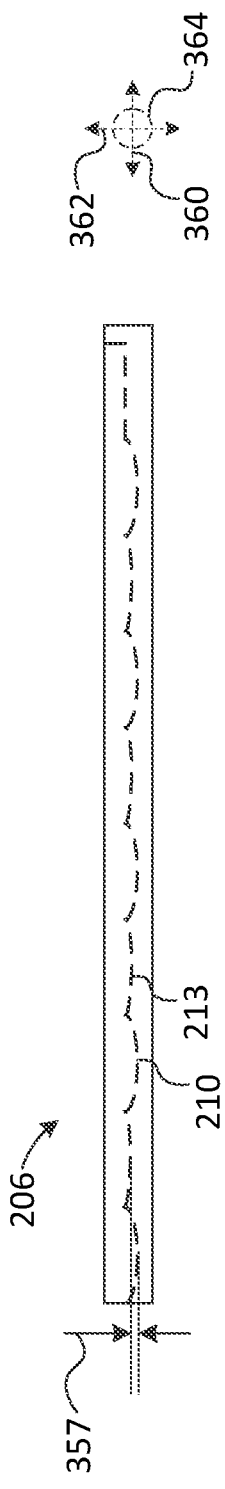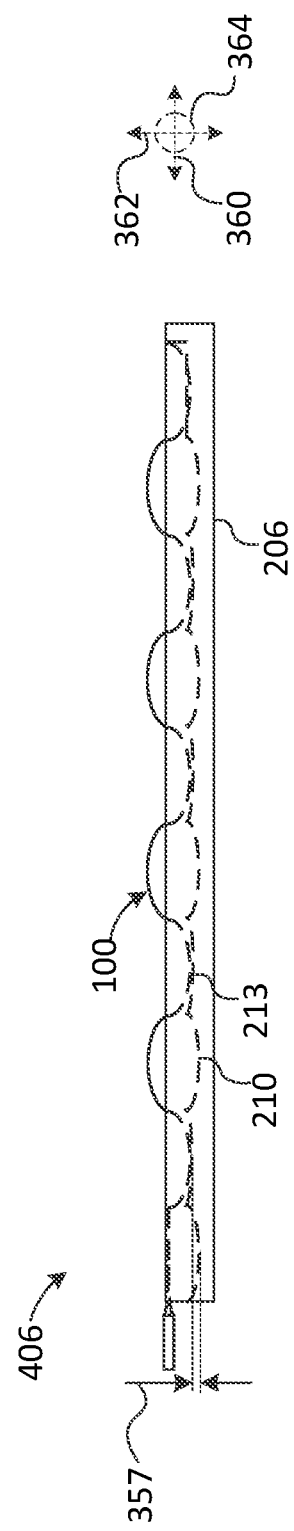

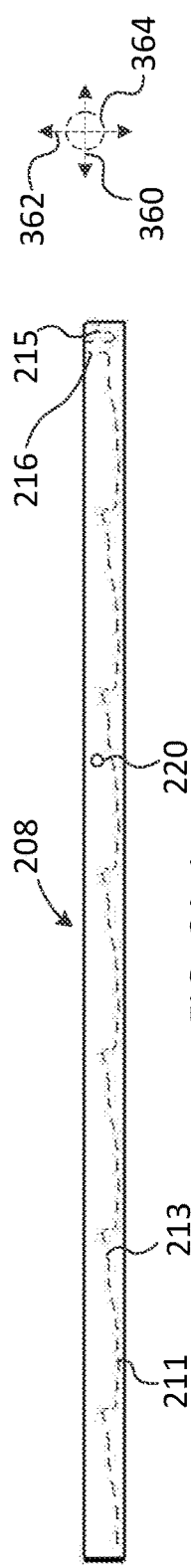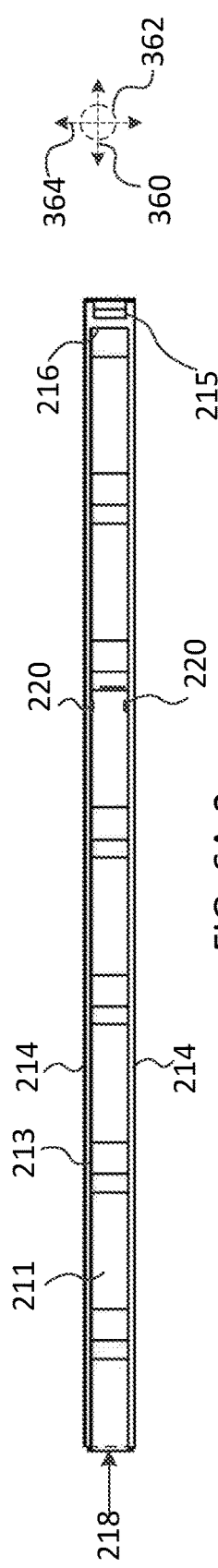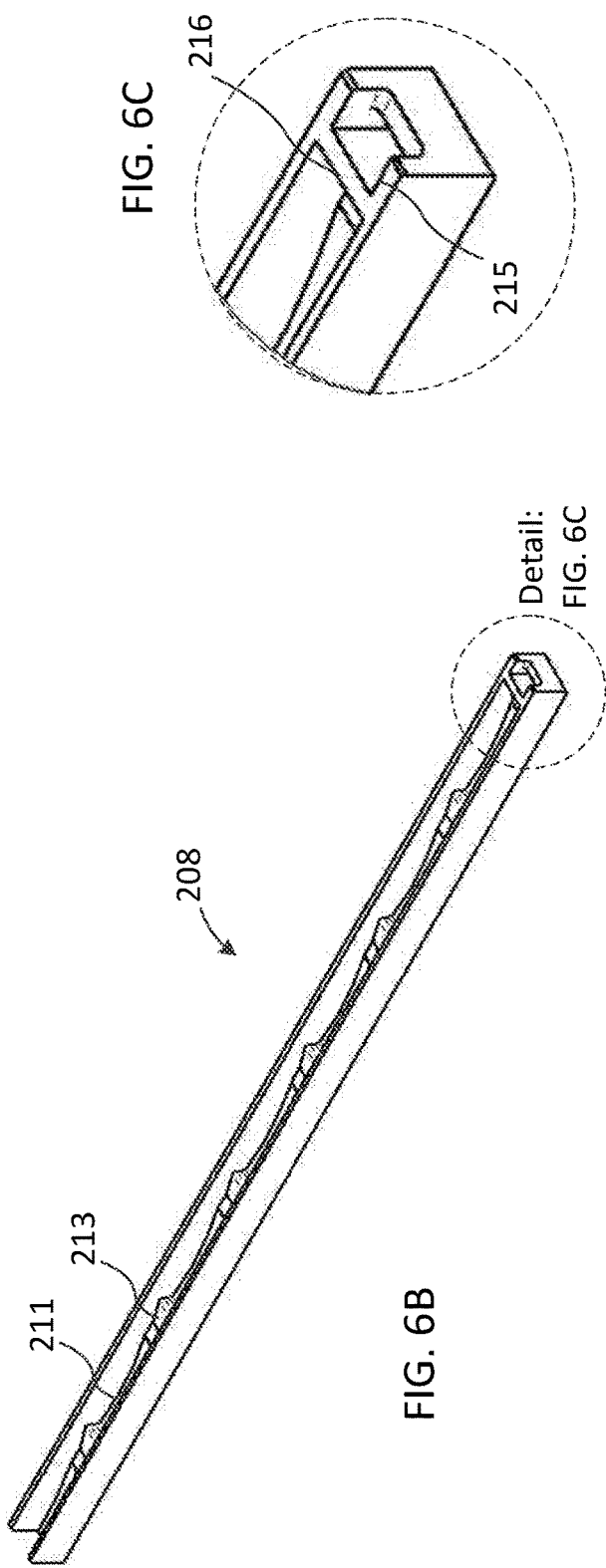

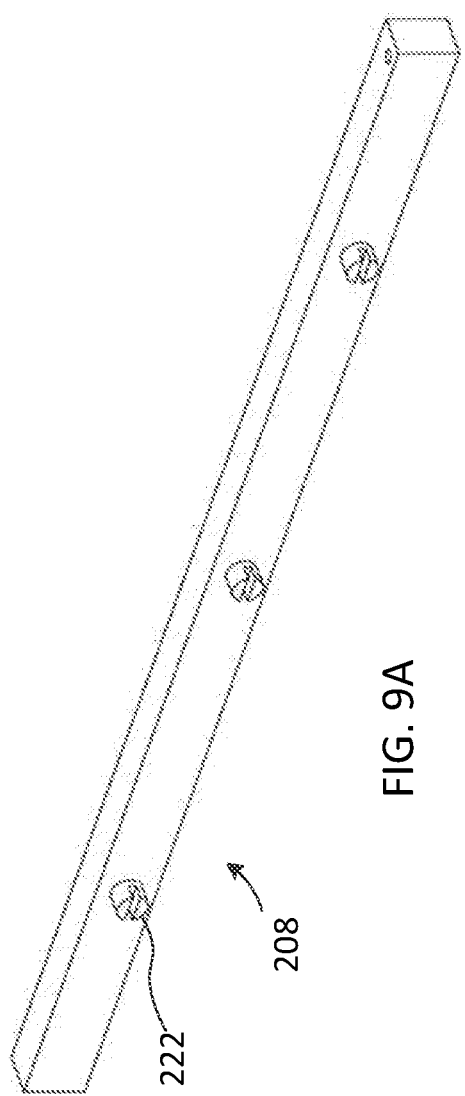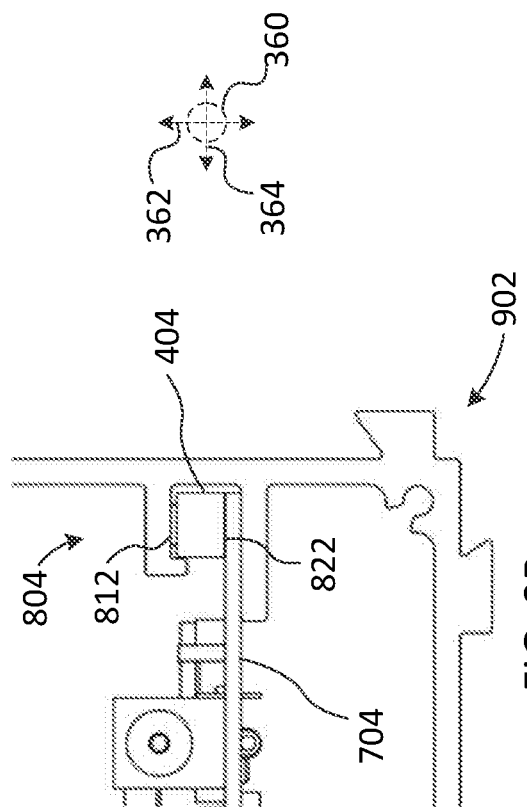

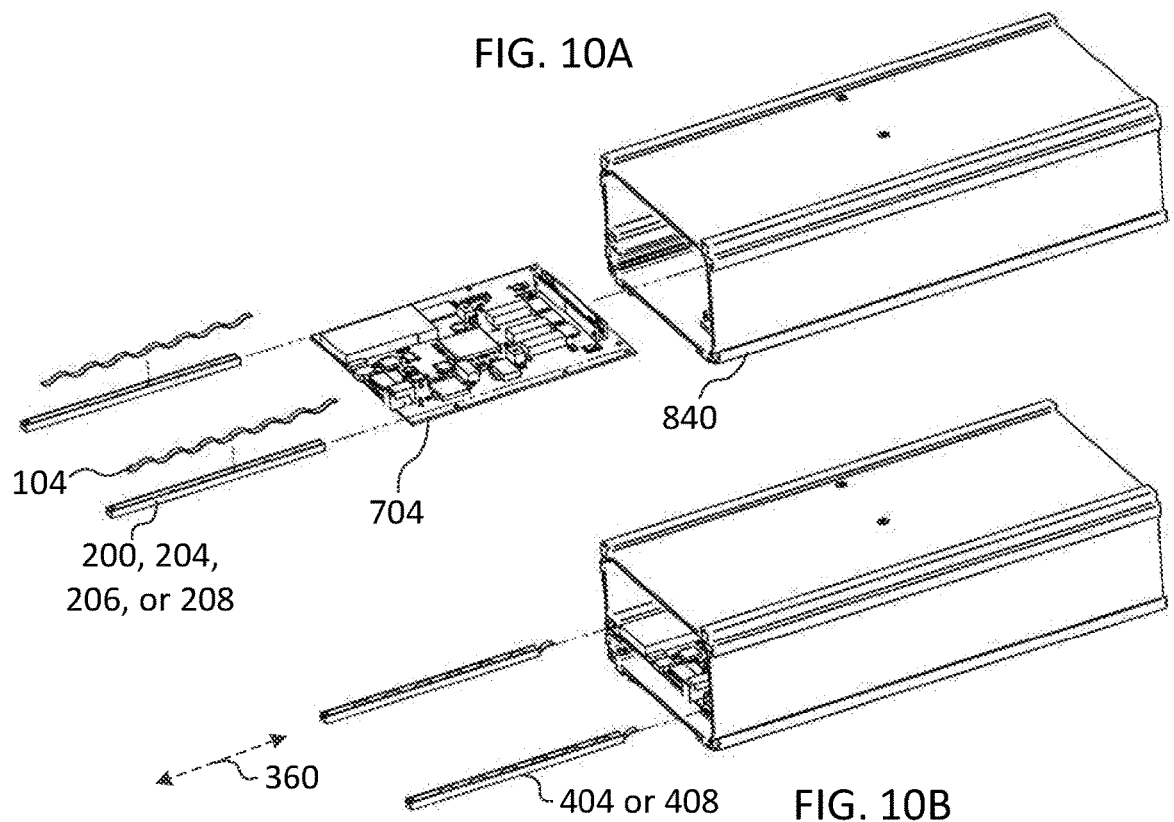
FIG. 10A
FIG. 10B
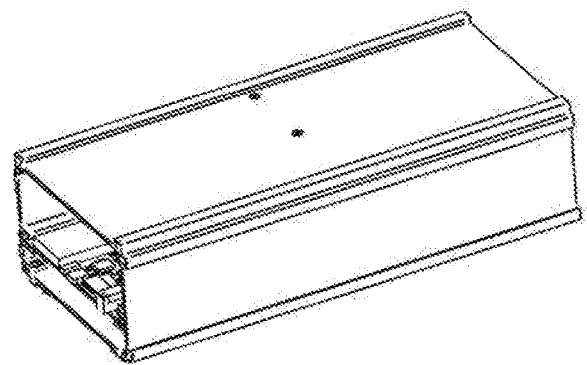
FIG. 10C

SPRING LOCK

RELATED APPLICATIONS

This patent application is a continuation of U.S. patent application Ser. No. 13/887,128, filed May 3, 2013 and entitled SPRING LOCK, which is incorporated herein by reference in its entirety.

GOVERNMENT SPONSORED RESEARCH

The invention was made, at least in part, with support from the U.S. Government under Grant No. N00173-12-D-2004-0001, which was awarded by the Naval Research Laboratory (NRL). The U.S. Government has certain rights in the invention.

TECHNICAL FIELD

The present disclosure relates to a spring lock.

SUMMARY

Applicants have identified the need for a low-cost, easy to use, circuit board (PCB) retention system that requires few or no tools to secure a PCB to a computer housing or chassis. The present disclosure in aspects and embodiments addresses these various needs and problems by providing a spring locking mechanism.

In embodiments, the spring lock includes a sinusoidal spring comprising: one or more crests and troughs formed along a length of the sinusoidal spring, the length extending along a sliding axis, the one or more crests and troughs forming a sinusoidal spring profile; and a lock bar comprising a track extending along the sliding axis, the track configured to hold the sinusoidal spring and allow the sinusoidal spring to move along the sliding axis, the track comprising one or more depressions and plateaus, the depressions and plateaus forming a lock bar profile. The spring lock is locked when the sinusoidal spring profile and the lock bar profile are out-of-phase and the spring lock is unlocked when the sinusoidal spring profile and the lock bar profile are in-phase.

In embodiments, the sinusoidal spring profile and the lock bar profile are regular and symmetric about a locking axis, the locking axis being perpendicular to the sliding axis. In another embodiment, the sinusoidal spring profile and the lock bar profile are non-symmetric about the locking axis, the locking axis being perpendicular to the sliding axis. In yet another embodiment, the sinusoidal spring profile and the lock bar profile are non-symmetric about the sliding axis.

In embodiments, the track comprises walls defining a track width, the track width being slightly larger than a sinusoidal spring width. In another embodiment, the walls comprise one or more protrusions configured to retain the sinusoidal spring along a locking axis while allowing the sinusoidal spring to move along the sliding axis, the locking axis being perpendicular to the sliding axis.

In embodiments, the lock bar further comprises an anchoring block at one end of the lock bar, the anchoring block restricting the sinusoidal spring motion along the sliding axis. The lock bar may further comprise a removal component.

In embodiments, the one or more depressions form at least one primary sinusoidal depression and the one or more plateaus form at least one primary sinusoidal plateau. In another embodiment, the at least two primary sinusoidal depressions form a primary sinusoidal depression period; the at least two primary sinusoidal plateaus form a primary sinusoidal plateau period, and the primary sinusoidal depression period and the primary sinusoidal plateau period are substantial equal to the sinusoidal spring period.

In embodiments, the primary sinusoidal depression period is out-of-phase with the primary sinusoidal plateau period or the at least two primary sinusoidal plateaus comprise at least two secondary sinusoidal depressions.

In another embodiment, the one or more depressions form a primary sinusoidal depression and a secondary sinusoidal depression, the primary and secondary sinusoidal depressions configured to restrict the sinusoidal spring and lock bar from involuntarily shifting from a locked position to an unlocked position. A secondary sinusoidal depression surface may be configured to restrict motion of the sinusoidal spring relative to the lock bar.

Also disclosed is a method for securing a component between an upper static surface and a lower static surface, the method including: providing a sinusoidal spring having a sinusoidal spring period along a sliding axis, a sinusoidal amplitude along a locking axis, and a width along a lateral axis, the sliding axis, locking axis and lateral axis are all perpendicular to one another and providing a lock bar comprising a track along the sliding axis, the track configured to allow the sinusoidal spring to move along the sliding axis between an unlocked and a locked position. The method further includes placing the sinusoidal spring, lock bar, and flat component between the upper static surface and the lower static surface and moving the sinusoidal spring, relative to the lock bar, along the sliding axis from the unlocked to the locked position.

In another method, a shortest distance between the upper static surface and the lower static surface is greater than or equal to a combined unlocked profile thickness of the sinusoidal spring, lock bar, and flat component when the sinusoidal spring and the lock bar are in the unlocked position and is less than a combined locked profile thickness of the sinusoidal spring, lock bar, and flat component when the sinusoidal spring and the lock bar are in the locked position.

In another embodiment, a spring lock includes a sinusoidal spring having one or more crests or troughs along a locking axis, the crests or troughs forming a sinusoidal spring profile, a length along a sliding axis, and a width along a lateral axis, wherein the sliding axis, locking axis and lateral axis are all perpendicular to one another. The spring lock further includes a lock bar that has a track along the sliding axis, the track comprising one or more depressions or plateaus, the depressions or plateaus forming a lock bar profile; wherein the sinusoidal spring profile and the lock bar profile are configured to be in-phase or out-of-phase with respect to each other.

In embodiments, the spring lock is configured to allow the sinusoidal spring to move along the sliding axis to change the spring lock between the unlocked and locked positions. In other embodiments, the lock bar is configured to restrict motion of the sinusoidal spring along the lateral axis. A lock bar may further comprise an anchoring block at one end of the lock bar, the anchoring block configured to restrict the sinusoidal spring motion along one direction of the sliding axis.

BRIEF DESCRIPTION OF THE DRAWINGS

FIGS. 1A-1 and 1A-2 illustrate an elevation and plan view of a sinusoidal spring;

FIG. 1B illustrates an elevation view of a sinusoidal spring;

FIG. 1C illustrates an isometric view of a sinusoidal spring;

FIGS. 2A-1 and 2A-2 illustrate an elevation and plan view of a lock bar;

FIGS. 2B-1 and 2B-2 illustrate an elevation view of a lock bar;

FIG. 2C illustrates an isometric view of a lock bar;

FIG. 3A illustrates a spring lock in an "unlocked" configuration;

FIG. 3B illustrates the spring lock shown in FIG. 3A in a "locked" configuration;

FIG. 3C illustrates another spring lock in an "unlocked" configuration;

FIG. 3D illustrates the spring lock shown in FIG. 3C in a "locked" configuration;

FIG. 5A illustrates another lock bar with a secondary sinusoidal depression period;

FIG. 5B illustrates a spring lock with the lock bar shown in FIG. 5A;

FIGS. 6A-1 and 6A-2 illustrate an elevation and plan view of another lock bar;

FIG. 6B illustrates an isometric view of the lock bar shown in FIG. 6A;

FIG. 6C illustrates an isometric detail view of a removal component;

FIG. 9A illustrates a lock bar with retaining posts;

FIG. 9B illustrates an end view of a spring lock in use with a circuit board in a computer housing; and FIGS. 10A, 10B, and 10C illustrate an assembly drawing of a circuit board being inserted into a housing and secured with a spring lock.

DETAILED DESCRIPTION

Figure 4A:
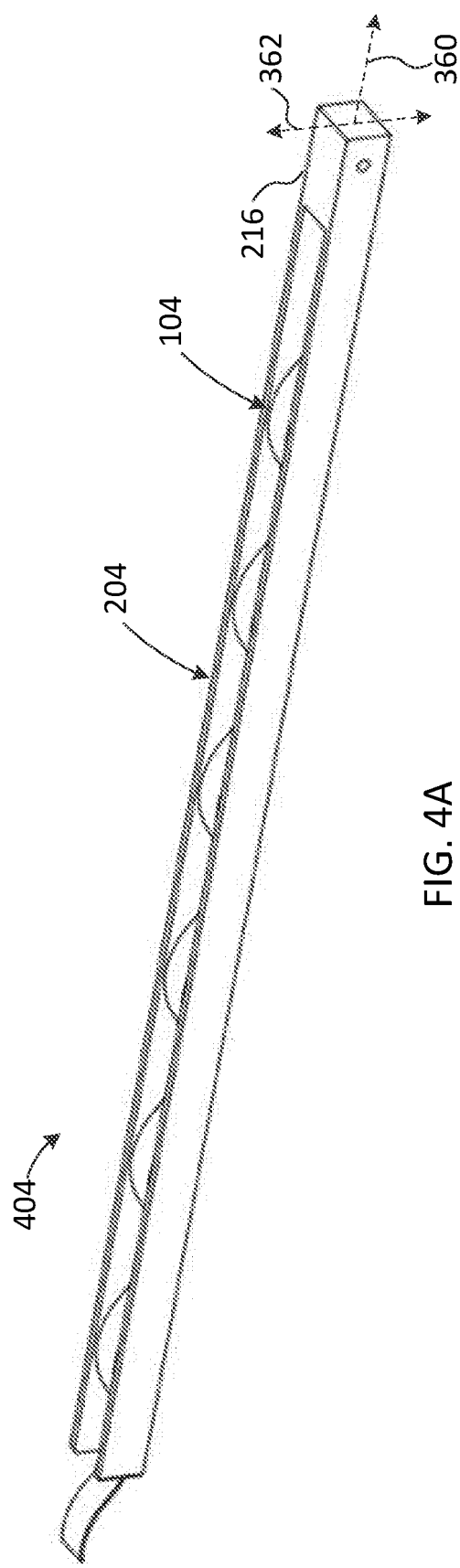
FIG. 4A illustrates another spring lock in an "unlocked" configuration.

The present disclosure covers apparatuses and associated methods for a spring lock. In the following description, numerous specific details are provided for a thorough understanding of specific preferred embodiments. However, embodiments can be practiced without one or more of the specific details, or with other methods, components, materials, etc. In some cases, well-known structures, materials, or operations are not shown or described in detail in order to avoid obscuring aspects of the preferred embodiments. Furthermore, the described features, structures, or characteristics may be combined in any suitable manner in a variety of alternative embodiments. Thus, the following more detailed description of the embodiments of the present invention, as illustrated in some aspects in the drawings, is not intended to limit the scope of the invention, but is merely representative of the various embodiments of the invention.

In this specification and the claims that follow, singular forms such as "a," "an," and "the" include plural forms unless the content clearly dictates otherwise. All ranges disclosed herein include, unless specifically indicated, all endpoints and intermediate values. In addition, "optional," "optionally," or "or" refer, for example, to instances in which subsequently described circumstance may or may not occur, and include instances in which the circumstance occurs and instances in which the circumstance does not occur. The terms "one or more" and "at least one" refer, for example, to instances in which one of the subsequently described circumstances occurs, and to instances in which more than one of the subsequently described circumstances occurs.

FIGS. 1A-1 and 1A-2 illustrate an elevation (shown on top) and a plan view (shown on bottom) of one embodiment of a sinusoidal spring 100. In embodiments, the sinusoidal spring 100 has a sinusoidal spring period 150 along a sliding axis 360, a peak-to-peak or sinusoidal amplitude 152 along the locking axis 362, and a width 154 along a lateral axis 364. The sliding, locking, and lateral axis are all perpendicular to one another and their relations is illustrated to the right of the sinusoidal spring 100 in FIGS. 1A-1 and 1A-2. In embodiments, the sinusoidal spring period 150 and sinusoidal amplitude 152 may be on the order of a few inches, an inch, or fractions of an inch. For example, the sinusoidal spring period 150 may be ¼, ½, 1, 2, 4, 8, 12, or more inches and the sinusoidal amplitude 152 may be ¼, ½, 1, 2, 4, 8, 12, or more inches.

The sinusoidal spring 100 may further comprise one or more crests 112 and troughs 110. In the illustrated embodiment, the sinusoidal spring has four crests 112 and five troughs 110. More or fewer crests 112 or troughs 110 may be included depending on the overall length of the sinusoidal spring 100 and length of the sinusoidal spring period 150.

In this disclosure, the term "sinusoidal spring" refers to a spring with crests or troughs as opposed to other types of springs such as helical, conical, torsional, or clock springs. A sinusoidal spring need not be in the shape of a true sinusoid, may be nonsymmetrical, or may not have an irregular pattern. A sinusoidal spring may only have one or more sets of crests or troughs. For example, a sinusoidal spring may have as few as one crest and two troughs or two crests and one trough. The crests and troughs may be any suitable shape or profile.

The sinusoidal spring 100 may be made from any suitable flexible material such as spring steel, phosphor-bronze, Mylar (biaxially-oriented polyethylene terephthalate), aluminum, copper, epoxy impregnated carbon fiber, or resilient plastics. The material may be selected based on the desired mechanical properties such as stiffness or locking force, chemical properties such as corrosion resistance, or heat transfer properties.

The sinusoidal spring 100 may further include a handle 114. The handle 114 may be used to slide the sinusoidal spring 100 without tools along the sliding axis 360 between an unlocked and locked position, as will be described below. The handle 114 may be made from the same material as the sinusoidal spring 100 or may be made from another suitable material, such as rigid plastic, e.g., acrylonitrile butadiene styrene (ABS), polyvinyl chloride (PVC), acrylic, or other polymers, etc.

The sinusoidal spring width 154 may be on the order of an inch or a fraction of an inch. For example, the sinusoidal spring width 154 may be ¼, ½, 1, 2, 4, 8, 12, or more inches. Similarly, the sinusoidal spring width 154 may be equal, greater than, or less than the sinusoidal spring thickness.

FIGS. 1A-1 and 1A-2 illustrate the sinusoidal spring 100 thickness as being thin relative to the width 154, i.e., the sinusoidal spring 100 thickness is less than the width 154. In other embodiments, the sinusoidal spring 100 may have a different cross-section (e.g., square, rectangular, or round). The sinusoidal spring 100 may be a wire of various gauge (AWG) thickness. For example, in embodiments, the sinusoidal spring 100 may be anywhere from 16 AWG (0.0641 inches in diameter) to 8 AWG (0.1285 inches in diameter).

FIG. 1B illustrates another sinusoidal spring 102 with two troughs 110 and one crest 112. Sinusoidal spring 102 is thicker and has six nodes (n), two nodes for each trough 110 or crest 112. Increasing the number of nodes, increasing the thickness, width 354, or selecting a material with a higher Young's modulus of elasticity may increase the sinusoidal spring stiffness or locking force for a given compression.

FIG. 1C illustrates in an isometric view of another sinusoidal spring 104. FIG. 1C further illustrates the relationship between the sliding axis 360, locking axis 362, and lateral axis 364.

FIGS. 2A-1, 2A-2, 2B, and 2C illustrate various embodiments of a lock bar 200, 202, and 204, respectively. FIGS. 2A-1 and 2A-2 illustrate an elevation (top) and plan view (bottom) of a lock bar 200. In embodiments, the lock bar 200, 202, or 204 comprises a slotted track 218 with primary sinusoidal depressions 210 and a primary sinusoidal plateau 212 along the sliding axis 360. The primary sinusoidal depressions 210 and primary sinusoidal plateaus 212 may be 180 degrees out of phase to each other. Two walls or guides 214 define the width of the slotted track 218. The width of the slotted track 218 may be wider than the width 154 of the sinusoidal spring 100, 102, or 104. The slotted track 218 is configured to allow the sinusoidal spring 100, 102, or 104 to move along the sliding axis 360 but constrain the sinusoidal spring 100, 102, or 104 along the lateral axis 364 between the two walls or guides 214.

In other embodiments, the slotted track 218 may be configured to hold more than one sinusoidal spring 100, 102, or 104. Additionally, two or more sinusoidal springs may move or operate independently from one another. Two or more sinusoidal springs 100, 102, or 104 in a slotted track 218 may provide a greater locking force than a single sinusoidal spring 100, 102, or 104.

In embodiments, the primary sinusoidal depression period 250 may be equal to the sinusoidal spring period 150. The primary sinusoidal depressions 210 have a depression depth 356 as measured relative to the primary sinusoidal plateau 212.

The lock bar 200 may also comprise a header 216 and an anchoring hole 217. In this embodiment, the header 216 may restrict movement of the sinusoidal spring along one direction of the sliding axis 360.

FIGS. 2B-1 and 2B-2 illustrate another lock bar 202. Lock bar 202 also has a slotted track 218 and a header 216. Lock bar 202 has only two primary sinusoidal depressions 210 and one primary sinusoidal plateau 212 to match the two troughs 110 and one crest 112 of sinusoidal spring 102 (shown in FIG. 1B). The number, size (e.g., period or amplitude), or profile of the primary sinusoidal depressions 210 and primary sinusoidal plateaus 212 may match the number, size, or profile of troughs 110 and crests 112.

FIG. 2C illustrates in an isometric view another lock bar 204 with the slotted track 218, two walls or guides 214, primary sinusoidal depressions 210, primary sinusoidal plateaus 212, header 216, and anchoring hole 217. FIG. 1C further illustrates the relationship between the sliding axis 360, locking axis 362, and lateral axis 364. The lock bar 204 illustrates shorter primary sinusoidal plateaus 212 as compared to lock bars 200 or 202. The primary sinusoidal plateaus 212 may be shorter or longer to adjust the desired sliding distance of a sinusoidal spring between an unlocked and a locked position, as described below.

Referring to FIGS. 2A-1, 2A-2, 2B, and 2C, the lock bar 200, 202, or 204 may further include protrusions 220 configured to retain a sinusoidal spring 100, 102, or 104 in the slotted track 218. FIGS. 2A-1, 2A-2, 2B, and 2C each show two sets of protrusions 220. In embodiments, more or fewer protrusions may be included with a lock bar. The protrusions 220 may extend from the walls or guides 214 of the slotted track 218. In the illustrated figures, the protrusions 220 are shown as symmetrical pairs. In embodiments, two or more protrusions 220 may be staggered along the length of the walls or guides 214.

The protrusions 220 may allow an operator to "snap" a sinusoidal spring 100, 102, or 104 into the slotted track 218 such that the sinusoidal spring 100, 102, or 104 is retained in the slotted track 218 by the protrusions 220. The protrusions may further allow the sinusoidal spring 100, 102, or 104 to move freely along the sliding axis 360 at least half a wavelength from a "locked" to an "unlocked" position or from an "unlocked" to a "locked" position. The protrusions 220 may be configured to secure the sinusoidal spring 100, 102, or 104 along the locking axis 362 yet allow the sinusoidal spring 100, 102, or 104 to move relative to the lock bar at least half a wavelength along the sliding axis 360.

A lock bar 200, 202, or 204 may be made of any suitable material such as plastic, e.g., acrylonitrile butadiene styrene (ABS), polyvinyl chloride (PVC), acrylic, or other polymers, etc. A lock bar 200, 202, or 204 may be made of metal, e.g., copper, aluminum, titanium, or steel, etc. A lock bar 200, 202, or 204 may be made of wood. The lock bar may be manufactured on a 3-D printer, injection molded, or milled etc.

FIG. 3A-3D are elevation drawings illustrating embodiments of a spring lock 400 and 402. In embodiments, the spring lock may comprise a sinusoidal spring 100 and a lock bar 200. The sinusoidal spring 100, 102, and lock bar 200 and 202 may be the embodiments illustrated in FIGS. 1A-1, 1A-2, 1B, 2A-1, 2A-2, and 2B. As shown in FIGS. 3A and 3C, the sinusoidal spring 100 or 102, may rest inside the primary sinusoidal depression 210 of the lock bar 200 or 202. In this configuration, the sinusoidal spring 100 or 102 and lock bar 200 or 202 are "in phase" or in a relaxed, "unlocked" position. As shown in FIGS. 3B and 3D, the sinusoidal spring 100 or 102, may rest on top of the slotted track (not labeled) of the lock bar 200 or 202, i.e., the troughs 112 of the sinusoidal spring 100 or 102 rest on top of the primary periodic plateaus 212 of the lock bar. In this sense, the sinusoidal spring 100 or 102 and lock bar 200 or 202 are "out of phase" or in the "locked" position. Therefore, in embodiments, a "locked" spring lock may be one that has a sinusoidal spring period out of phase with a lock bar's primary sinusoidal depressions and an "unlocked" spring lock is one that has a sinusoidal spring period in phase with a lock bar's sinusoidal depressions.

In other embodiments, a "locked" spring lock may be one that has a sinusoidal spring positioned on top of a slotted track or on top of one or more plateaus of a lock bar. Additionally, an "unlocked" spring lock may be one that has a sinusoidal spring positioned inside a slotted track or inside the depressions of a lock bar.

Referring back to FIGS. 1A-1, 1A-2, 1B, 1C, 2A-1, 2A-2, 2B, 2C, 3A-3D, and 4A-4B, in embodiments, the sinusoidal spring 100, 102, or 104 and lock bar 200, 202, or 204, have regular, symmetric, or repeating patterns of crests 110, troughs 112, primary sinusoidal depressions 210, and primary sinusoidal plateaus 212. In other embodiments, the crests 110, troughs 112, depressions 210, or plateaus 212 need not be regular, symmetric, nor repeating. Instead, the features or profile of a "sinusoidal" spring or lock bar may be arranged in any arbitrary manner that is matched by the mating component.

The lock bar 200 or 202 may be configured to allow the sinusoidal spring 100 or 102 to move along the sliding axis 360 between an "unlocked" (FIGS. 3A and 3C) and "locked" (FIGS. 3B and 3D) position, while restricting relative motion along the lateral axis 364 because of the wall or guides 214, or the locking axis 362 because of the protrusions 220. In the depicted embodiments, the sinusoidal spring 100 or 102, with the aid of the handle 114, moves along the sliding axis 360 towards the header 216 to change from an "unlocked" to a "locked" position. In other embodiments, the spring lock 400 or 402 may alternate from a "locked" to an "unlocked" configuration or from an "unlocked" to a "locked" configuration by moving the sinusoidal spring 100 or 102 along the sliding axis 360 away from the header 216. In still other embodiments, the sinusoidal spring 100 or 102 may be fixed in its position relative to external components (not shown) and the lock bar 200 or 202 may move relative to the sinusoidal spring 100 or 102 such that the spring lock 400 or 402 changes from a "locked" or "unlocked" configuration to an "unlocked" or "locked" configuration. In these last embodiments, a handle or an anchoring hole (depicted as 217 in FIGS. 2A-1, 2A-2, and 2C) may be used to move the lock bar 200 or 202 along the sliding axis 360.

Figure 4B:
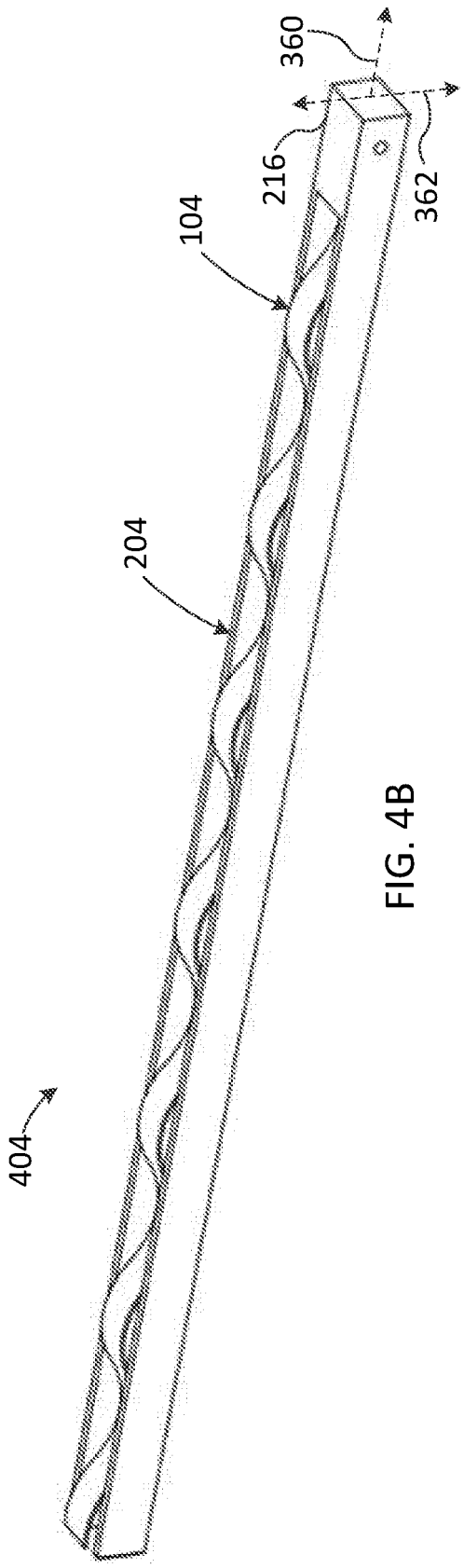
FIG. 4B illustrates the spring lock shown in FIG. 4A in a "locked" configuration.

FIGS. 4A and 4B illustrate in an isometric view another embodiment of a spring lock 404 in an "unlocked" (FIG. 4A) and "locked" (FIG. 4B) position. As the sinusoidal spring 104 slides along the sliding axis 360 towards the header 216, the sinusoidal spring 104 moves from resting inside the primary sinusoidal depressions (not labeled) to being on top of the primary sinusoidal plateaus (not labeled). Like the other embodiments, by shifting the sinusoidal spring 104 half a wavelength relative to the lock bar 204, the thickness of the spring lock 404 along the locking axis 362 subsequently changes.

Referring now to FIGS. 5A and 5B, a lock bar 206 may comprise one or more secondary sinusoidal depressions 213. In embodiments, the secondary sinusoidal depressions 213 may restrict movement of the sinusoidal spring 100 along the sliding axis 360 when the spring lock is in the "locked" configuration. The sinusoidal spring 100 may rest inside the secondary sinusoidal depressions 213 in the "locked" configuration, similar to how the sinusoidal spring 100 rests inside the primary sinusoidal depressions 210 in the "unlocked" configuration. The secondary sinusoidal depressions 213 may better secure a sinusoidal spring 100 even though the depression depth 357, and thus the maximum sinusoidal spring compression distance, is less than the depression distance 356 of spring locks 400 or 402 (shown in FIGS. 3B and 3D). The restriction in movement of the sinusoidal spring 100 relative to the lock bar 206 may prevent an inadvertent shift from a "locked" configuration to an "unlocked" configuration.

FIGS. 5A and 5B illustrate the primary sinusoidal depressions 210 and the secondary sinusoidal depressions 213 as smooth curves, somewhat matching the profile of the sinusoidal spring 100. The sinusoidal depressions 210 or 213 may comprise any suitable shape. For example, the sinusoidal depressions 210 or 213 may individually be v-shaped, flat with end ridges, or saw-toothed shaped. The shapes may be modified to increase or decrease surface friction between the sinusoidal spring 100 and the lock bar 206. Additionally, the surface of the secondary sinusoidal depressions 213 may be modified or coated with a coating to change the frictional force between a sinusoidal spring 100 and the lock bar 206 with the spring lock 406 in the "locked" position. For example, increased surface friction may better restrict motion of the sinusoidal spring 100 relative to the lock bar 206 or otherwise secure the sinusoidal spring 100 in the "locked" position.

FIGS. 6A-1 and 6A-2 illustrate an elevation (top) and plan (bottom) view of another embodiment of a lock bar 206 with primary sinusoidal depressions 211 and primary sinusoidal plateaus 213 along the sliding axis 313. The primary sinusoidal depressions 211 and primary sinusoidal plateaus 213 are shaped differently than the previously illustrated embodiments. The primary sinusoidal depressions 211 and primary sinusoidal plateaus are designed to better secure a sinusoidal spring (not shown) in a "locked" configuration with the lock bar 206. The lock bar 206 may include other similar features as lock bars 200, 202, or 204. For example, lock bar 206 also includes a sliding track 218 and walls or guides 214. Lock bar 206 may also include protrusions 220 and a header 216.

The lock bar 206 may include a removal component 215 with the detail illustrated in FIG. 6C, similar to the anchoring hole 217 (shown in FIGS. 2A-1, 2A-2, and 2C). The removal component 215 may be configured to accept a removal tool (not shown) to push or pull the lock bar along the sliding axis 360.

Figure 7A:
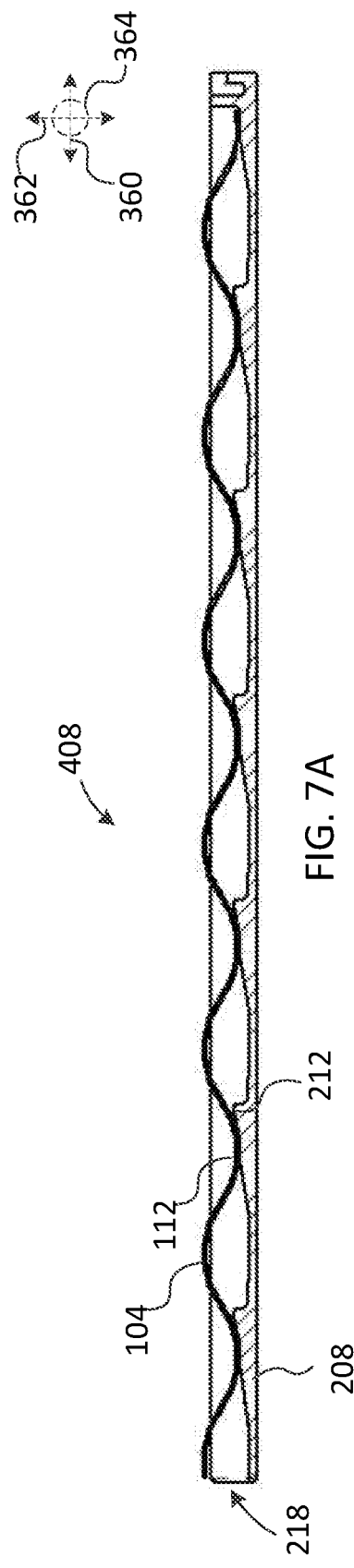
FIG. 7A illustrates an elevation view of another spring lock in a "locked" configuration.
Figure 7B:
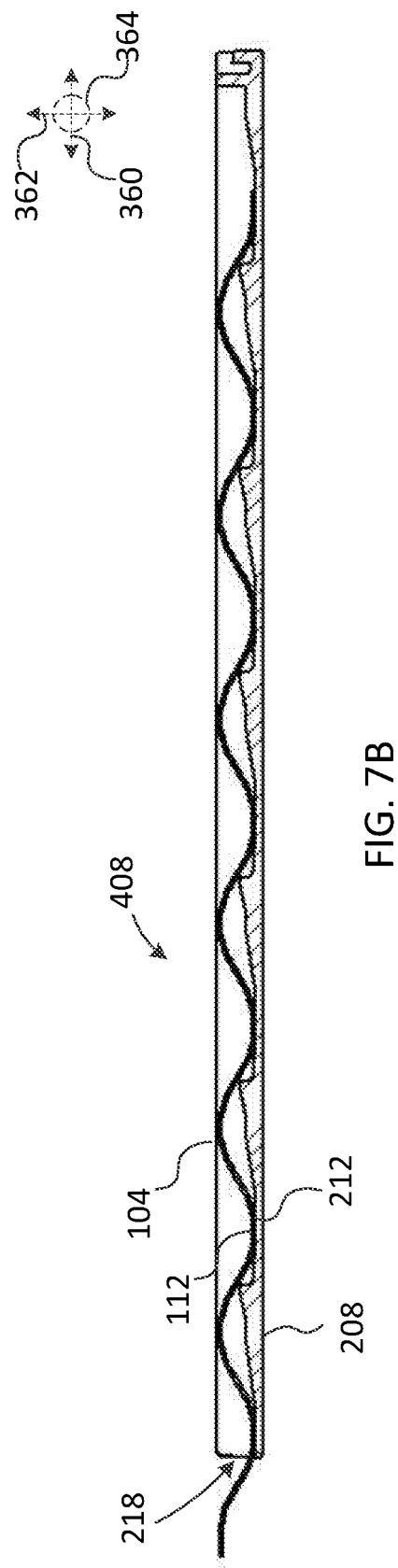
FIG. 7B illustrates an elevation view of the spring lock of FIG. 7A in an unlocked configuration.

FIGS. 7A and 7B are elevation drawings illustrating embodiments of a spring lock 408. In embodiments, the spring lock 408 may comprise a sinusoidal spring 104 and a lock bar 208. As shown in FIG. 7A, the sinusoidal spring 104, may rest in or on top of the slotted track 218 of the lock bar 208, i.e., the troughs 112 of the sinusoidal spring 104 rest on top of the primary sinusoidal or periodic plateaus 212 of the lock bar 208. In this configuration, the sinusoidal spring 104 and lock bar 208 are "out of phase" or in the "locked" position. As shown in FIG. 7B, the sinusoidal spring 100 may rest down inside or within the slotted track 118 of the lock bar 208, i.e., the troughs 112 of the sinusoidal spring 104 rest on top of the primary sinusoidal or periodic depressions 210 of the lock bar 208. In this configuration, the sinusoidal spring 100 and lock bar 208 are "in phase" or in a relaxed, "unlocked" position.

The spring locks in FIGS. 3A-3D, 4A, 4B, 5B, 7A, and 7B are illustrated in "unlocked" or "locked" positions but the sinusoidal springs 100, 102, or 104, and the lock bars 200, 202, 204, 206, or 208 are not constrained along the locking axis by upper or lower anchored or static surfaces. Therefore, the sinusoidal springs in the above-mentioned illustrations do not exert a "locking" force against the illustrated lock bars.

Figure 8A:
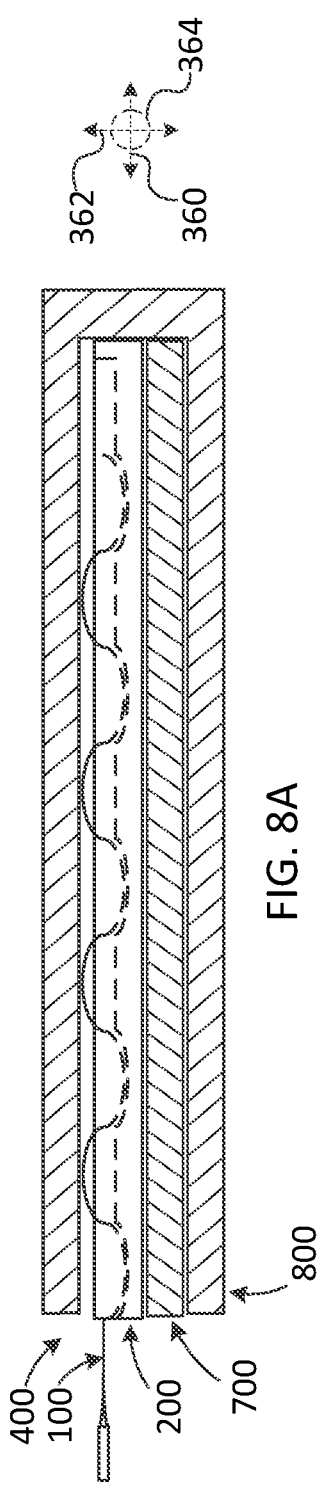
FIG. 8A illustrates a sinusoidal spring lock in an "unlocked" configuration.
Figure 8B:
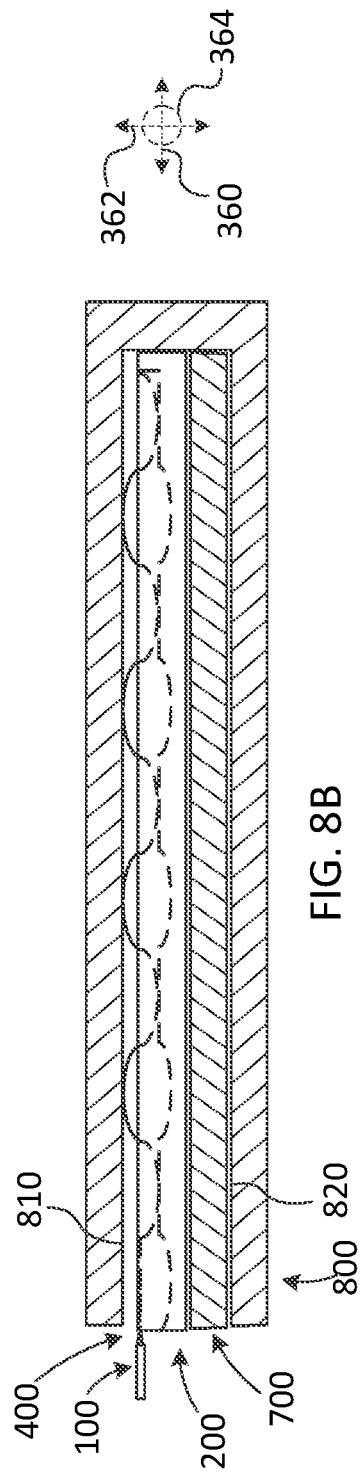
FIG. 8B illustrates the sinusoidal spring lock shown in FIG. 8A in a "locked" configuration.
Figure 8C:
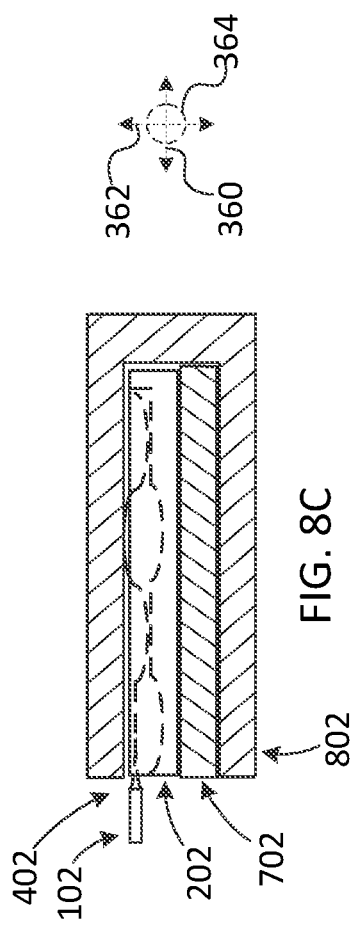
FIG. 8C illustrates another spring lock in a "locked" configuration.

FIGS. 8A-8C illustrate a spring lock 400 or 402 used to lock a planar component 700 inside a channel 800. In FIG. 8A, the spring lock 400 and planar component 700 are positioned inside the channel 800 such that the sinusoidal spring 100 does not impart a significant, or no force, on the lock bar 200 along the locking axis 362. As described above, the sinusoidal spring 100 rests inside the slotted track (not labeled) of the lock bar 200, i.e., the troughs (not labeled) of the sinusoidal spring 100 rest in the primary periodic depressions (not labeled) of the lock bar 200. In this position, the sinusoidal spring 100 and lock bar 200 are "in phase" or in a relaxed, "unlocked" position. In this configuration, the spring lock 400 (including the sinusoidal spring 100 and the lock bar 200) and planar component 700 may slide in or out of the channel 800 along the sliding axis 360 without significant force being applied along the sliding axis 360 to the spring lock 400 or planar component 700.

In FIG. 8B, the sinusoidal spring 100 has been repositioned relative to the lock bar 200 such that the sinusoidal spring 100 is on top of the primary periodic plateaus (not labeled) of the lock bar 200. In this position, the sinusoidal spring 100 and lock bar 200 are "out of phase" or in the "locked" position. The sinusoidal spring 100 is compressed along the locking axis 362 and exerts a force against the upper surface 810 of the channel 800 and the primary periodic plateaus (not labeled) of the lock bar 200 such that the sinusoidal spring 100 compresses the lock bar 200 and planar surface 700 against the bottom surface 820 of the channel 800. The sinusoidal spring 100 may apply even pressure against the lock bar 200 at each point where the sinusoidal spring 100 touches the lock bar 200 or along the entire length of the lock bar 200. The compressive force of the planar surface 700 against the bottom surface 820 of the channel 800 is such that the planar component 700 is secured or "locked" into the channel 800. The compressive force applied in the "locked" configuration may prevent the lock bar 200 or planar surface 700 from slipping out of the channel 800 when subjected to vibrational movement.

In FIGS. 3A-3D, the change in elevation of the sinusoidal spring 100 or 102 between an "unlocked" and "locked" position may be equal to a depression depth 376. In an "unlocked" position, the spring lock 400 or 402 is thinner along the locking axis 362. In the "locked" configuration, the spring lock 400 or 402 has a greater thickness along the locking axis 362. Therefore, by shifting the sinusoidal spring 100 or 102 half a wavelength relative to the lock bar 200 or 202, the thickness of the spring lock 400 or 402 along the locking axis 362 subsequently changes.

The change in thickness of the spring lock 400 or 402 between the configurations illustrated in FIG. 3A or 3C and the configurations illustrated in FIG. 3B or 3D may be the maximum compression distance of the sinusoidal spring 100 or 102 between an "unlocked" and a "locked" position. The "unlocked" spring lock height 371 in FIGS. 3A and 3C is the overall height of the spring lock 400 or 402 in an "unlocked" and unconstrained configuration. The spring lock height 372 in FIGS. 3B and 3D is the overall height of the spring lock 400 or 402 in a "locked" and unconstrained configuration. The spring lock 400 or 402 in FIGS. 3B and 3D is "unconstrained" because the spring lock 400 is not compressed in a channel by upper or lower static surfaces. The maximum difference in height between the "unlocked" spring lock height 371 and the "locked" spring lock height 372 is equal to the depression depth 376. Thus, the depression depth 376 may also be equal to the maximum sinusoidal spring compression distance in a "locked" configuration.

The compressive or locking force of the sinusoidal spring 100 or 102 against the lock bar 200 or 202, and thus the compressive or locking force of the spring lock 400 or 402, is a function of the number of nodes (labeled "n" in FIG. 1B), thickness, width 354, and Young's modulus, or other material properties of the sinusoidal spring 100, 102, or 104. The compressive or locking force of a spring lock is also a function of the sinusoidal spring compression distance. Thus, for a given sinusoidal spring with fixed properties of number of nodes, thickness, width, and Young's modulus, increasing the sinusoidal spring compression distance or the depression depth 376 may increase the compressive or locking force of a spring lock.

Referring again to FIGS. 8A-8C, there may be more or fewer "touch points" between a sinusoidal spring 100 or 102 and a lock bar 200 or 202 to secure the planar surface 700 or 702 inside the channel 800 or 802. For example, the sinusoidal spring 100 depicted in FIG. 8B provides four "touch points" against the top surface 810 of the channel 800 and five "touch points" against the primary periodic plateaus (not labeled) of the lock bar 200. The combined touch points may provide the necessary frictional force necessary to "lock" the spring lock 400 and the planar component 700 inside the channel 800 such that the spring lock 400 and planar component 700 are not free to slide (without an external force applied) along the sliding axis 360 out of the channel 800. As a further illustration, only two "touch points" are provided between sinusoidal spring 102 and the lock bar 202 depicted in FIG. 8C.

The increased number of touch points between the sinusoidal spring 100 and the lock bar 200 as compared to the sinusoidal spring 102 and the lock bar 202 means that there may be greater locking friction along the sliding axis 360 for spring lock 400 as compared to spring lock 402. Increasing the number of touch points increases the potential locking force along the sliding axis 360 between the sinusoidal spring 100 or 102 and the lock bar 200 or 202 and thus the overall lock force of the spring lock 400 or 402 to lock a planar component 700 or 702 inside a channel 800 or 802.

The compressive force of the spring may be modified to increase or decrease the "locking" force of the spring lock 400 or 402 inside the channel 800 or 802. As described previously, increasing the number of nodes (illustrated in FIG. 1B), increasing the thickness or width 354 of the sinusoidal spring 100 or 102, or selecting a material for the sinusoidal spring 100 or 102 with a higher Young's modulus of elasticity may increase the sinusoidal spring stiffness or locking force for a given compression.

A lock bar may include other features to secure a lock bar to a planar surface. For example, FIG. 9A is a schematic drawing illustrating a bottom view of one embodiment of a lock bar 208. In this embodiment, the lock bar 208, which may be similar to the lock bars shown in FIG. 2A-1, 2A-2, 2B, 2C, 5A-5B, or 6A-6B, has retaining posts 222 on the bottom side of the lock bar 208. Retaining posts 222 may allow a user to insert a planar surface (not shown) with a spring lock attached to it into a channel or computer chassis (not shown) in a single operation. The retaining posts may also constrain movement of the spring lock relative to a planar component in the sliding axis 360 and lateral axis 364.

FIG. 9B is an end view schematic drawing illustrating a spring lock 404 in use with a circuit board 704 in a computer housing 902. In this illustration, the spring lock 404 is placed with a circuit board 704 between the walls 812 and 822 of a channel 804 in a computer housing 902. FIG. 9B shows a view of the front or back of the spring lock with the lateral axis 364 of the spring lock running left to right in the figure.

One could, for example, position a spring lock 404 in the unlocked position against a planar component 704 (e.g., a circuit board, metal plate, wood plate, etc.) inside a channel 804. The combined thickness of the spring lock 404 in an "unlocked" position and planar component 704 may be as great as the distance between the upper surface 812 and lower surface 822 of the channel 804. The unconstrained thickness of the spring lock 404 in a "locked" position and planar component 704 may be greater than the distance between the upper surface 812 and lower surface 822 of the channel 804. The lock bar 404 or the sinusoidal spring (not labeled) could be manually adjusted to the "locked" configuration, thus applying a spring force to the planar component 704 and the upper and lower walls 812 and 822 of the channel 804. The spring force applied to the planar component 704 and channel walls 812 and 822 along the locking axis 362 may establish a good thermal contact between the planar component 704 with the walls 812 and 822 (but more especially 822) of the channel 802. The spring lock 404 may be used in maintaining a circuit board within operational temperature boundaries or to secure an electrical component inside a housing to prevent the component from breaking connections with other cables or components in a system.

FIGS. 10A-10C illustrate an assembly drawing of a circuit board 704 being inserted into a computer housing or chassis 840. The circuit board 704 may be slid into channels (not labeled) into the chassis 840. A pair of spring locks 404 or 408 may then be slid into the same channels until the sinusoidal spring 104 presses against a header (not shown) at the end of the channel to move the sinusoidal spring 104 relative to the lock bar 200, 204, 206, or 208, such that the spring lock 404 or 408 is in the "locked" position.

In an alternative method, the spring lock 404 may be attached to the circuit board 704 before the circuit board 704 and the spring lock 404 are slid into the chassis 840 in a single operation. As the circuit board 704 is slid all the way into the chassis 840, a header (not shown) at the end of the chassis channel presses the sinusoidal spring 104 along the sliding axis 360 such that the spring lock is in the "locked" configuration. The circuit board 704 may remain "locked" in the computer chassis 840 until a removal tool (not shown) is used to pull the lock bar 200, 204, 206, or 208 out of the channel (not labeled), using the removal component 215 (shown in FIGS. 6A-1, 6A-2, 6B, and 6C) or the anchoring hole 217 (shown in FIGS. 2C, 4A, and 4B).

One operational aspect of a spring lock is positioning the spring lock in contact with the object or objects that need to be secured or clamped. Anchored or static surfaces may refer to the walls of a channel or adjustable jaws of a clamping device. Compressing a sinusoidal spring translates to applying a spring force to both the static surface and the secured object or planar surface. The spring force applied to the secured object assures a more uniform and effective mechanical and thermal contact between the secured object and the static surfaces.

The figures of the present application illustrate a planar surface or circuit board and a computer housing or chassis. Other suitable applications of a spring lock include woodworking clamps or work piece retention in factory automation. Many processes in factory automation include applying a constant force to objects to keep them from shifting or moving. The force is typically applied via electromechanical devices that require considerable amounts of energy and are inefficient. In woodworking, maintaining strong mechanical contact is useful in temporarily securing two wood pieces together while a glue bond cures or until one can permanently secure the pieces together with nails or screws. For circuit boards, good thermal contact may be important in allowing heat to transfer out of the circuit board in order to maintain the circuit board within operational temperatures.

It will be appreciated that various of the above-disclosed and other features and functions, or alternatives thereof, may be desirably combined into many other different systems or applications. Also, various presently unforeseen or unanticipated alternatives, modifications, variations or improvements therein may be subsequently made by those skilled in the art, and are also intended to be encompassed by the following claims.

What is claimed is:

1. A spring lock comprising:
   a sinusoidal spring comprising one or more crests and troughs formed along a length of the sinusoidal spring, the length extending along a sliding axis, the one or more crests and troughs forming a sinusoidal-spring profile; and
   a monolithic, homogenous lock bar comprising:
      a track extending along the sliding axis and comprising:
         at least two primary sinusoidal depressions forming a primary sinusoidal depression period, and
         at least two primary sinusoidal plateaus forming a primary sinusoidal plateau period, the at least two primary sinusoidal plateaus each comprising a secondary sinusoidal depression such that there are at least two secondary sinusoidal depressions,
         wherein the at least two primary sinusoidal depressions and the at least two primary sinusoidal plateaus with their secondary sinusoidal depressions form a lock-bar profile; and
      first and second walls extending contiguously upward from either side of the track and generally perpendicular to the track; the first wall, track, and second wall forming a contiguous U-shape configured to hold the sinusoidal spring on the track and between the first and second wall,
   wherein:
      the spring lock is locked when the sinusoidal-spring profile and the lock-bar profile are out-of-phase and the spring lock is unlocked when the sinusoidal-spring profile and the lock bar profile are in-phase.

2. The spring lock of claim 1, wherein the at least two secondary sinusoidal depressions are configured to restrict the sinusoidal spring and monolithic, homogenous lock bar from involuntarily shifting from a locked position to an unlocked position.

3. The spring lock of claim 2, wherein a surface of the secondary sinusoidal depression is configured to restrict motion of the sinusoidal spring relative to the monolithic, homogenous lock bar.

4. The spring lock of claim 1, wherein the sinusoidal-spring profile and the lock-bar profile are regular and symmetric about a locking axis, the locking axis being perpendicular to the sliding axis.

5. The spring lock of claim 1, wherein the sinusoidal-spring profile and the lock-bar profile are non-symmetric about the locking axis, the locking axis being perpendicular to the sliding axis.

6. The spring lock of claim 1, wherein the sinusoidal spring profile and the lock bar profile are non-symmetric about the sliding axis.

7. The spring lock of claim 1, wherein the first and second walls comprise one or more protrusions extending from the first and second walls and the one or more protrusions are configured to retain the sinusoidal spring along a locking axis while allowing the sinusoidal spring to move along the sliding axis, the locking axis being perpendicular to the sliding axis.

8. The spring lock of claim 1, wherein the lock bar further comprises an anchoring block at one end of the lock bar, the anchoring block restricting the sinusoidal spring motion along the sliding axis.

9. The spring lock of claim 1, wherein the lock bar further comprises a removal component.

10. The spring lock of claim 1, wherein the primary sinusoidal depression period is out-of-phase with the primary sinusoidal plateau period.

11. A method for securing a flat component between an upper static surface and a lower static surface, the method comprising:

provide a sinusoidal spring comprising one or more crests and troughs formed along a length of the sinusoidal spring, the length extending along a sliding axis, the one or more crests and troughs forming a sinusoidal-spring profile;

providing a monolithic, homogenous lock bar comprising:

a track extending along the sliding axis and comprising:

at least two primary sinusoidal depressions forming a primary sinusoidal depression period, and at least two primary sinusoidal plateaus forming a primary sinusoidal plateau period, the at least two primary sinusoidal plateaus each comprising a secondary sinusoidal depression such that there are at least two secondary sinusoidal depressions, wherein the at least two primary sinusoidal depressions and the at least two primary sinusoidal plateaus with their secondary sinusoidal depressions form a lock-bar profile; and first and second walls extending contiguously upward from either side of the track and generally perpendicular to the track; the first wall, track, and second wall forming a contiguous U-shape configured to hold the sinusoidal spring on the track and between the first and second wall, wherein:

the spring lock is locked when the sinusoidal-spring profile and the lock-bar profile are out-of-phase and the spring lock is unlocked when the sinusoidal-spring profile and the lock bar profile are in-phase;

placing the sinusoidal spring, the monolithic, homogenous lock bar, and the flat component between the upper static surface and the lower static surface; and moving the sinusoidal spring, relative to the monolithic, homogenous lock bar, along the sliding axis from the unlocked to the locked position.

12. The method of claim 11, wherein a shortest distance between the upper static surface and the lower static surface:

is greater than or equal to a combined unlocked profile thickness of the sinusoidal spring, the monolithic, homogenous lock bar, and the flat component when the sinusoidal spring and the monolithic, homogenous lock bar are in the unlocked position; and is less than a combined locked profile thickness of the sinusoidal spring, the monolithic, homogenous lock bar, and the flat component when the sinusoidal spring and the monolithic, homogenous lock bar are in the locked position.

* * * * *